US010446369B1

(12) United States Patent
Phillips et al.

(10) Patent No.: US 10,446,369 B1
(45) Date of Patent: Oct. 15, 2019

(54) SYSTEMS AND METHODS FOR INTERFEROMETRIC END POINT DETECTION FOR A FOCUSED ION BEAM FABRICATION TOOL (71) Applicant: National Technology & Engineering Solutions of Sandia, LLC, Albuquerque, NM (US)

(72) Inventors: Brian Scott Phillips, Rio Rancho, NM (US); Steven Norris Ball, Albuquerque, NM (US); Gregory Paul Salazar, Rio Rancho, NM (US); Randy J. Shul, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 178 days.

(21) Appl. No.: 15/623,239

(22) Filed: Jun. 14, 2017

(51) Int. Cl.
*G01B 11/14* (2006.01)
*H01J 37/30* (2006.01)

(52) U.S. Cl.
CPC .......... *H01J 37/3005* (2013.01); *G01B 11/14* (2013.01); *H01J 2237/31749* (2013.01)

(58) Field of Classification Search
CPC .................. G01B 11/14; H01J 37/3005; H01J 2237/31749
See application file for complete search history.

(56) References Cited

U.S. PATENT DOCUMENTS

| 3,699,334 | A | | 10/1972 | Cohen et al. | |
|---|---|---|---|---|---|
| 4,639,301 | A | | 1/1987 | Doherty et al. | |
| 5,055,696 | A | * | 10/1991 | Haraichi | H01J 37/228 250/423 R |
| 5,384,463 | A | * | 1/1995 | Honjo | G03F 1/86 250/396 R |
| 5,656,811 | A | * | 8/1997 | Itoh | G01N 1/32 250/310 |
| 5,798,529 | A | | 8/1998 | Wagner | |
| 6,039,000 | A | * | 3/2000 | Libby | H01J 37/3005 118/723 E |
| 6,900,447 | B2 | | 5/2005 | Gerlach et al. | |
| 7,238,294 | B2 | * | 7/2007 | Koops | G03F 1/74 204/157.41 |

(Continued)

*Primary Examiner* — David P Porta
*Assistant Examiner* — Djura Malevic
(74) *Attorney, Agent, or Firm* — Medley, Behrens & Lewis, LLC (57) ABSTRACT

Various technologies for providing an operator of a focused ion beam (FIB) system with navigational and processing data are described herein. An exemplary system includes a broadband light source and a narrowband light source that emit light to a target of the FIB. An optical detector receives reflections of the broadband light from the target and outputs data that is used to generate two-dimensional images of the target in a region near a location of incidence of the FIB at the target. An interferometer receives reflections of the narrowband light from the target and outputs data indicative of an interference pattern of the narrowband reflections. A computing device computes a thickness of one or more material layers that make up the target based upon the interference pattern. A two-dimensional image of the target and an indication of the computed thickness are then displayed to the operator of the FIB.

19 Claims, 7 Drawing Sheets

(56) References Cited

U.S. PATENT DOCUMENTS

| | | | | |
|---|---|---|---|---|
| 8,660,312 | B2* | 2/2014 | Cui | G01B 11/2441 |
| | | | | 382/106 |
| 9,574,868 | B2* | 2/2017 | Shaked | G01B 9/02057 |
| 9,910,256 | B2* | 3/2018 | Shaked | G01B 9/02057 |
| 2002/0170675 | A1* | 11/2002 | Libby | H01J 37/3056 |
| | | | | 156/345.39 |
| 2004/0021254 | A1* | 2/2004 | Sreenivasan | B29C 35/0888 |
| | | | | 264/406 |
| 2004/0021866 | A1* | 2/2004 | Watts | B29C 35/0888 |
| | | | | 356/401 |
| 2005/0068052 | A1* | 3/2005 | Patterson | G01R 31/307 |
| | | | | 324/750.16 |
| 2006/0285124 | A1* | 12/2006 | Hill | G03F 7/70591 |
| | | | | 356/521 |
| 2012/0006987 | A1* | 1/2012 | Rue | G01J 3/0208 |
| | | | | 250/332 |
| 2012/0211644 | A1* | 8/2012 | Zheng | G01J 9/00 |
| | | | | 250/208.2 |
| 2015/0049343 | A1* | 2/2015 | Shaked | G01B 9/02057 |
| | | | | 356/503 |
| 2015/0116721 | A1* | 4/2015 | Kats | G01J 3/26 |
| | | | | 356/454 |
| 2017/0153434 | A1* | 6/2017 | Shaked | G01B 9/02057 |
| 2018/0052276 | A1* | 2/2018 | Klienman | G02B 6/0035 |
| 2018/0052277 | A1* | 2/2018 | Schowengerdt | G02B 6/0035 |
| 2018/0052320 | A1* | 2/2018 | Curtis | G02B 6/0035 |
| 2018/0052501 | A1* | 2/2018 | Jones, Jr. | G02B 6/0035 |
| 2018/0059297 | A1* | 3/2018 | Peroz | G02B 6/0035 |
| 2018/0059304 | A1* | 3/2018 | Bhargava | G02B 6/0035 |

* cited by examiner

SYSTEMS AND METHODS FOR INTERFEROMETRIC END POINT DETECTION FOR A FOCUSED ION BEAM FABRICATION TOOL

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Focused ion beam (FIB) tools are commonly used in micro- and nano-scale additive and subtractive processing. FIBs find extensive use in micro- and nano-machining of micro-electromechanical systems (MEMS), materials science characterization and study, biology, semiconductor processing failure analysis, etc.

In applications relating to integrated circuit modification, FIB tools are commonly used to etch and deposit both conductive and insulating material. Theorized circuit corrections are often implemented by FIBs and their performance verified in a design stage prior to adjusting photomasks and altering large-scale production designs. With the development of flip-chip bonded devices and integrated circuits that include many levels of front-side metallization, circuit modification operations have begun to include back-side silicon processing, where an integrated circuit modification is implemented by etching the bulk substrate, generally silicon, using a FIB. Remaining surface thickness (RST) is an important parameter in performing back-side silicon integrated circuit modification. If too much of the silicon substrate is etched during FIB processing, circuitry on one or more transistor or device layers can be unintentionally damaged, rendering the electronics of the integrated circuit non-functional.

Conventional back-side FIB processing systems typically make use of subjective estimation of RST by an operator based on focus distance between an artifact found in the processed silicon surface and the underlying circuitry. Poor optical resolution of the artifact and a skill level of the FIB operator can reduce accuracy of this estimation. Other methods of estimating RST include removing the circuit being processed from the FIB processing device and performing ex-situ measurements of the RST. However, removing an integrated circuit from a vacuum chamber of a FIB tool to measure RST is time-consuming and introduces the possibility of circuit damage during handling. In-situ measurement can be accomplished by way of a pilot hole technique wherein a pilot hole is etched and its depth measured using the FIB. The pilot hole is etched using the FIB to remove all silicon in an area deemed to be benign to affecting operation of the circuit. In many cases, though, such an area is unavailable due to the possibility of damage to components of the circuit as a result of etching the pilot hole. In other cases, the pilot hole is too far away from an area of interest to provide an accurate measurement of the RST.

SUMMARY

The following is a brief summary of subject matter that is described in greater detail herein. This summary is not intended to be limiting as to the scope of the claims.

Various technologies pertaining to presentment of real-time, in-situ navigational data, including a thickness of one or more layers of a target of a FIB processing system, to an operator of the FIB system are described herein. In an exemplary embodiment, a FIB system includes a FIB emitter, a broadband infrared (IR) light source (e.g., an IR light bulb), a narrowband IR light source (e.g., an IR light emitting diode, or LED, or an IR laser), an IR optical detector, an IR interferometer, and an optical system that directs and focuses light from the sources. The FIB emitter emits a focused beam of ions toward a target in order to perform additive or subtractive processing of the target. For example, the FIB emitter emits the focused beam of ions such that the beam removes portions of a surface of the target over time. The FIB emitter can be controlled by an operator to control a location of incidence of the beam at the surface of the target, an intensity of the beam, etc.

The broadband IR light source and the narrowband IR light source emit light toward the target by way of the optical system. The optical system directs the light to the target in the vicinity (e.g., within 10 microns) of the location of incidence of the FIB at the surface of the target. The IR light from each of the broadband and narrowband IR light sources is reflected from the target and directed by the optical system to the IR optical detector and the IR interferometer, respectively. Thus, the IR optical detector receives the broadband IR light reflected from the target and the IR interferometer receives the narrowband IR light reflected from the target. The IR optical detector is configured to output data indicative of an intensity of the broadband IR light received by the IR optical detector in a two-dimensional plane. The data output by the IR optical detector can be processed by a computing device in connection with generating two-dimensional IR images of the surface of the target in the vicinity of the location of incidence of the FIB. The two-dimensional IR images can be presented to an operator of the FIB on a display, for example as an IR video feed of the surface of the target. The IR interferometer is configured to output data indicative of a thickness of at least one layer of material at the target in the vicinity of the FIB. An indication of the thickness of the at least one layer of material can be presented to the operator of the FIB on a display. Thus, the exemplary system presents the operator of the FIB with real-time thickness data of material layers at the target and real-time two-dimensional imagery of the target surface. The exemplary system can therefore enable the operator of the FIB to navigate the FIB to desired locations of additive or subtractive milling while simultaneously indicating a remaining amount of material at the surface in the vicinity of the FIB.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to providing navigational and remaining surface thickness (RST) data for a FIB processing system are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

Figure 1:
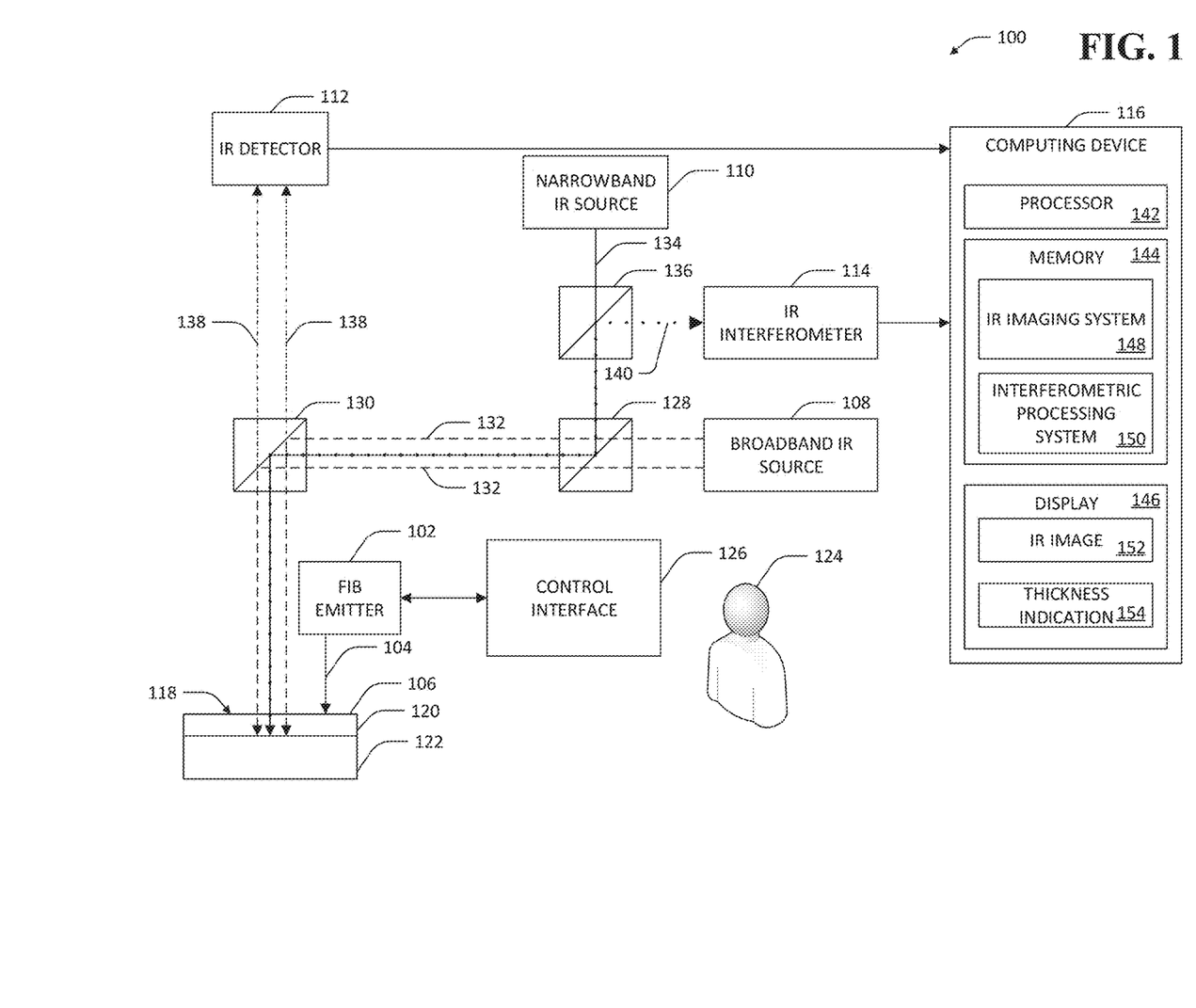
FIG. 1 is a functional block diagram of an exemplary FIB system that facilitates real-time presentment of two-dimensional IR imagery and surface layer thickness data in the vicinity of a location of incidence of the FIB at the target.

With reference to FIG. 1, an exemplary system 100 that facilitates enhanced control of a FIB processing device is illustrated. More specifically, the system 100 facilitates real-time presentment of remaining surface thickness (RST) and two-dimensional images of a target of a FIB processing device. The system 100 includes a FIB emitter 102 that emits a focused beam of ions 104 (e.g., positive Gallium ions) toward a target 106. The system 100 further includes a first infrared (IR) light source 108 and a second IR light source 110 that emit first and second IR light, respectively, to illuminate the target 106. The system 100 further comprises an IR optical detector 112 that receives a reflection of the first light from the target 106 and an IR interferometer 114 that receives a reflection of the second light from the target 106. The IR detector 112 and the IR interferometer 114 output data indicative of a two-dimensional image of the target and a thickness of at least one layer of material at the target 106, respectively. The system 100 additionally includes a computing device 116 that receives the data from the IR detector 112 and the IR interferometer 114 and outputs images of the target 106 and a thickness of at least one layer of material at the target 106 in real-time.

The FIB emitter 102 emits the ion beam 104 toward the target 106 in order to etch material from a surface 118 of the target 106 or deposit material onto the surface 118. By way of example, the target 106 can be an integrated circuit comprising a plurality of layers 120, 122 wherein the layers 120, 122 are made up of different materials. Furthering the example, the FIB emitter 102 can be used in connection with backside processing of the integrated circuit, and the layer 120 that comprises the surface 118 of the target 106 and that is struck by the ion beam 104 can be a silicon layer that is the bulk silicon substrate of the circuit. Continuing the example, the "lower" layer 122 can be a front-side metal layer.

The FIB emitter 102 can be controlled by a user 124 by way of a control interface 126 that is in communication with the FIB emitter 102. The control interface 126 can provide substantially any desired user interface with which the user 120 can interact in order to control the FIB emitter 102. For example, the control interface 126 can be or include a computing device coupled to electromechanical control devices that control movement and milling rate of the FIB emitter 102. In some exemplary embodiments (not shown), the control interface 126 is included in or implemented by way of the computing device 116.

The first IR light source 108 emits IR light 132 to illuminate the target 106. In the exemplary system 100, the IR light source 108 is a broadband light source (e.g., an incandescent light bulb) that emits light with a broad spectral characteristic comprising a wide range of wavelengths. For example, the broadband light source 108 can emit IR light in a spectral range having a bandwidth of at least 200 nm (e.g., 1000 nm). The light 132 emitted by the broadband IR source 108 is directed to the target by way of a first beam splitter 128 and a second beam splitter 130. The broadband IR source 108 emits the broadband IR light 132 along a path from the broadband IR source 108 to the first beam splitter 128, whereupon the broadband IR light 132 travels to the second beam splitter 130. The second beam splitter 130 then directs the broadband IR light 132 to the target 106.

The second IR light source 110 emits IR light 134 in connection with using interferometry to determine a thickness of one or more layers of the target 106. The second IR light source 110 is a narrowband IR light source (e.g., an IR laser, an IR LED, etc.) that emits light with a narrow spectral characteristic comprising a band of wavelengths that is narrower than the band of wavelengths emitted by the broadband IR source 108. In an example, the narrowband IR light source 110 emits the IR light 134 in a spectral range having a bandwidth of less than 200 nm. In another example, the narrowband IR light source 110 emits the IR light 134 in a bandwidth of less than 100 nm. In still another example, the narrowband IR light source 110 emits the IR light 134 in a bandwidth of less than 50 nm. The narrowband IR source 110 emits the narrowband IR light 134 to a third beam splitter 136. The third beam splitter 136 passes the narrowband IR light 134 to the first beam splitter 128. The first beam splitter 128 directs the narrowband IR light 134 to the second beam splitter 130. The second beam splitter 130 then directs the narrowband IR light 134 to the target 106.

When the broadband IR light 132 and the narrowband IR light 134 reach the target 106, the broadband light 132 and the narrowband light 134 are reflected in different proportions by each of the layers 120, 122 based upon a reflectance of each of the layers 120, 122 with respect to the wavelengths of each of the broadband light 132 and the narrowband light 134. For example, in the exemplary embodiment wherein the target 106 is an integrated circuit and the layer 120 comprising the surface 118 of the target 106 is silicon, a substantial majority (e.g., greater than 60%) of the energy of the broadband IR light 132 and the narrowband IR light 134 passes through the silicon layer 120. A substantial majority of the remaining energy of the broadband IR light 132 and the narrowband IR light 134 is reflected by, for example, a metallized layer 122 underneath the silicon layer 120. Reflected broadband IR light 138 and reflected narrowband IR light 140 travel back along the same path as the broadband IR light 132 and the narrowband IR light 134, from the target 106 to the second beam splitter 130.

The second beam splitter 130 directs the reflected broadband IR light 138 to the IR detector 112. The IR detector 112 receives the reflected broadband IR light 138 and outputs first data indicative of a two-dimensional image of the target 106. By way of example, the IR detector 112 can comprise a two-dimensional array of charge-coupled devices (CCDs) that each output a signal indicative of an intensity of light received at the CCD. The IR detector 112 outputs the first data to the computing device 116.

The second beam splitter 130 also directs the reflected narrowband IR light 140 back to the first beam splitter 128. The first beam splitter 128 is further configured to direct the reflected narrowband IR light 140 to the third beam splitter 136. The third beam splitter 136 is further configured to pass the reflected narrowband IR light 140 to the IR interferometer 114. The reflected narrowband IR light 140 comprises portions of the narrowband IR light 134 that are reflected by the surface 118 of the layer 120 and portions of the narrowband IR light 134 that are reflected by the layer 122. The IR interferometer 114 receives the reflected narrowband IR light 140 and outputs second data to the computing device 116, where the second data is indicative of interference between the narrowband IR light reflected by the surface 118 of the layer 120 and the narrowband IR light reflected by the layer 122.

The computing device 116 receives the first data from the IR detector 112 and the second data from the IR interferometer 114. The computing device includes at least one processor 142, memory 144 that comprises instructions that are executed by the processor 142, and a display 146. The memory 144 comprises an IR imaging system 148 and an interferometric processing system 150.

The IR imaging system 148 generates two-dimensional IR images of the target 106 based upon the first data received by the computing device 116 from the IR detector 112. Responsive to the IR imaging system 148 generating an IR image of the target 106, the image of the target can be presented on the display 146 as an IR image 152. The user 124 of the system 100 can operate the control interface 126 to control the FIB emitter 102 at least partially based upon the IR image 152. The IR detector 112 can be configured to output data to the computing device 116 at a sampling rate sufficient to allow the IR imaging system 148 to generate and display the IR image 152 a plurality of times per second. Thus, the IR image 152 can be a single image of the target 106 or the IR image 152 can be a video feed of the target 106.

Figure 2:
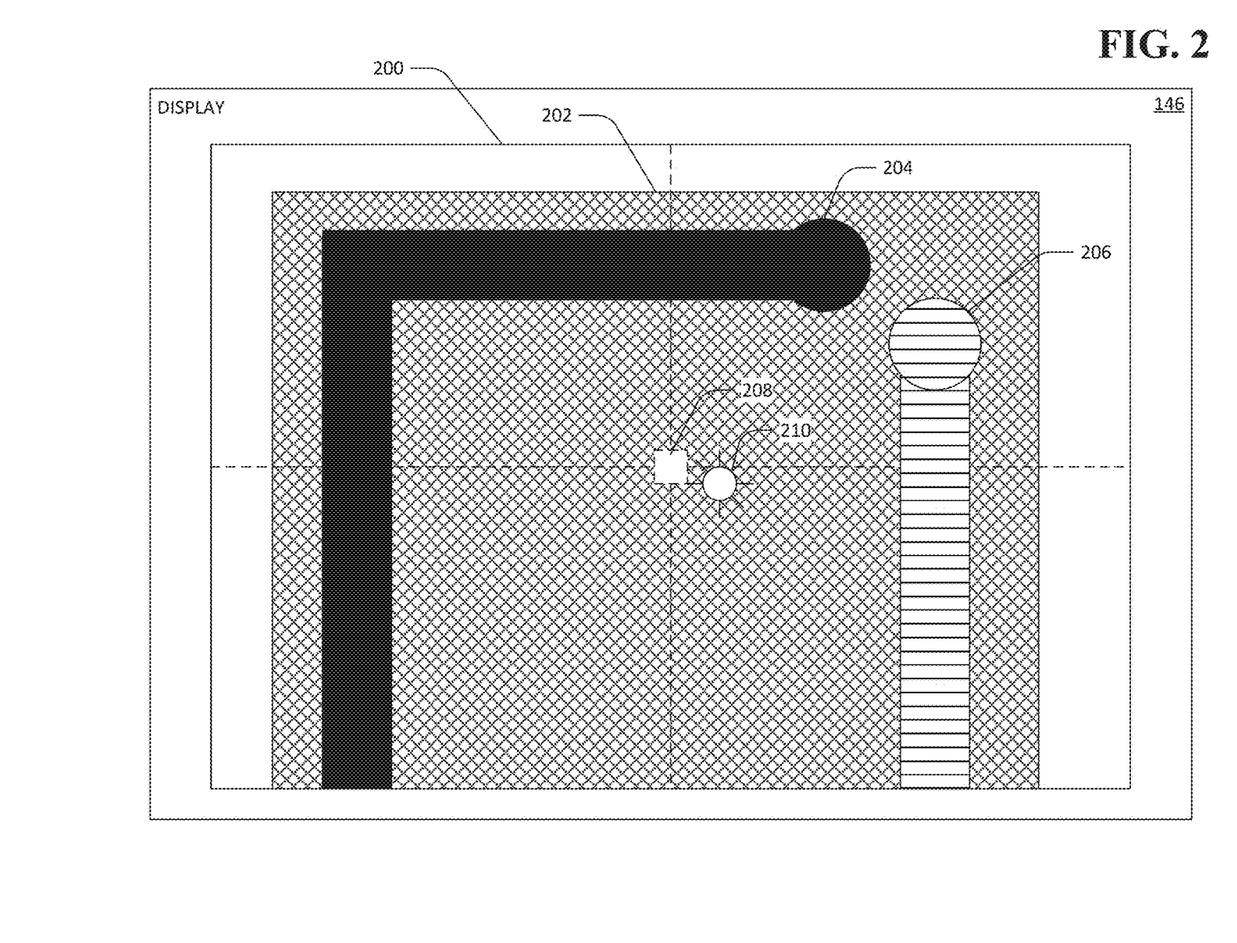
FIG. 2 is an illustration of an exemplary view of a two-dimensional image of the surface of a target of the exemplary FIB system.

Since one or more layers of the target 106 may be at least partially transparent to the broadband IR light 132, the IR image 152 can show multiple layers of the target. For example, referring now to FIG. 2 an exemplary IR image 200 presented by way of the display 146 is shown. In an example, the IR image 200 is an image of the back side of an integrated circuit, where the integrated circuit is the target of the FIB, and wherein a top layer of the circuit facing the view of the image is a silicon substrate layer 202. The IR image 200 shows features 204, 206 of the circuit being processed by the FIB in multiple layers below the substrate layer 202. For example, the features 204, 206 can be circuit traces or other circuit features (e.g., elements such as transistors, conductive paths, capacitive elements, etc.). The features 204, 206 and the substrate layer 202 can be displayed in the image 200 with differing brightness based upon intensity of light received at the IR detector 112 with respect to locations corresponding to the features 204, 206. In turn, the intensity of light received at a location corresponding to a feature depends upon a reflectance of the material that makes up the feature and a thickness of layers above the feature. Thus, the feature 204 may be brighter or dimmer than the feature 206 in the image 200 depending upon a relative reflectance of the features 204, 206 and a thickness of layers above each of the features 204, 206. The silicon substrate 202 may appear translucent in the image 200, since silicon is largely transparent to IR light. Further, to aid in navigation of the FIB by the operator 124, the image 200 can include an indication 208 of a location of incidence of the FIB at the target. While shown in the exemplary image 200 as a crosshair, the indication 208 can be substantially any visual indicator of the location of incidence of the FIB. In some embodiments, a location of incidence 210 of the narrowband IR light 134 at the target 106 may be visible in the image 200.

Referring again to FIG. 1, the interferometric processing system 150 generates data indicative of a thickness of at least one layer of the target 106 based upon the second data received by the computing device 116 from the IR interferometer 114. The interferometric processing system 150 generates the data indicative of the thickness using conventional processing techniques in interferometry. The interferometric processing system 150 can identify a difference in path length between the reflection 140 of the narrowband light as reflected by the layer 120 and the reflection 140 of the narrowband light as reflected by the layer 122 based upon the interference pattern indicated by the second data. The difference in path length thusly identified is inferred to be approximately equal to a thickness of the layer 120 of the target. An indication 154 of the thickness of the at least one layer of the target 106 can be displayed on the display 146 of the computing device 116. The thickness indication 154 can comprise a numerical value of the thickness, a symbolic graphical indicator, or other indication. The IR image 152 and the thickness indication 154 provide the operator 124 of the system 100 with in-situ information about the target 106, allowing the operator 124 to more accurately perform back-side circuit processing operations, and thereby reducing fabrication errors.

It is to be understood that while the broadband light source 108 and the narrowband light source 110 are described herein as being IR light sources, the light sources 108, 110 can emit light in any range of wavelengths suitable for imaging by way of the optical detector 112 and performing interferometry by way of the interferometer 114. For example, in some embodiments the layer 120 that comprises the surface 118 of the target 106 is made up of a material that is substantially opaque to IR wavelengths. In such embodiments, the light sources 108, 110, as well as the detector 112 and the interferometer 114, can be configured to operate with respect to different optical wavelengths. It is further to be understood that the IR detector 112 and the IR interferometer 114 can be configured to output data repeatedly over a period of time, and the computing device 116 can update the IR image 152 and the thickness indication 154 in real-time responsive to receiving new data from the IR detector 112 and the interferometer 114.

Figure 3:
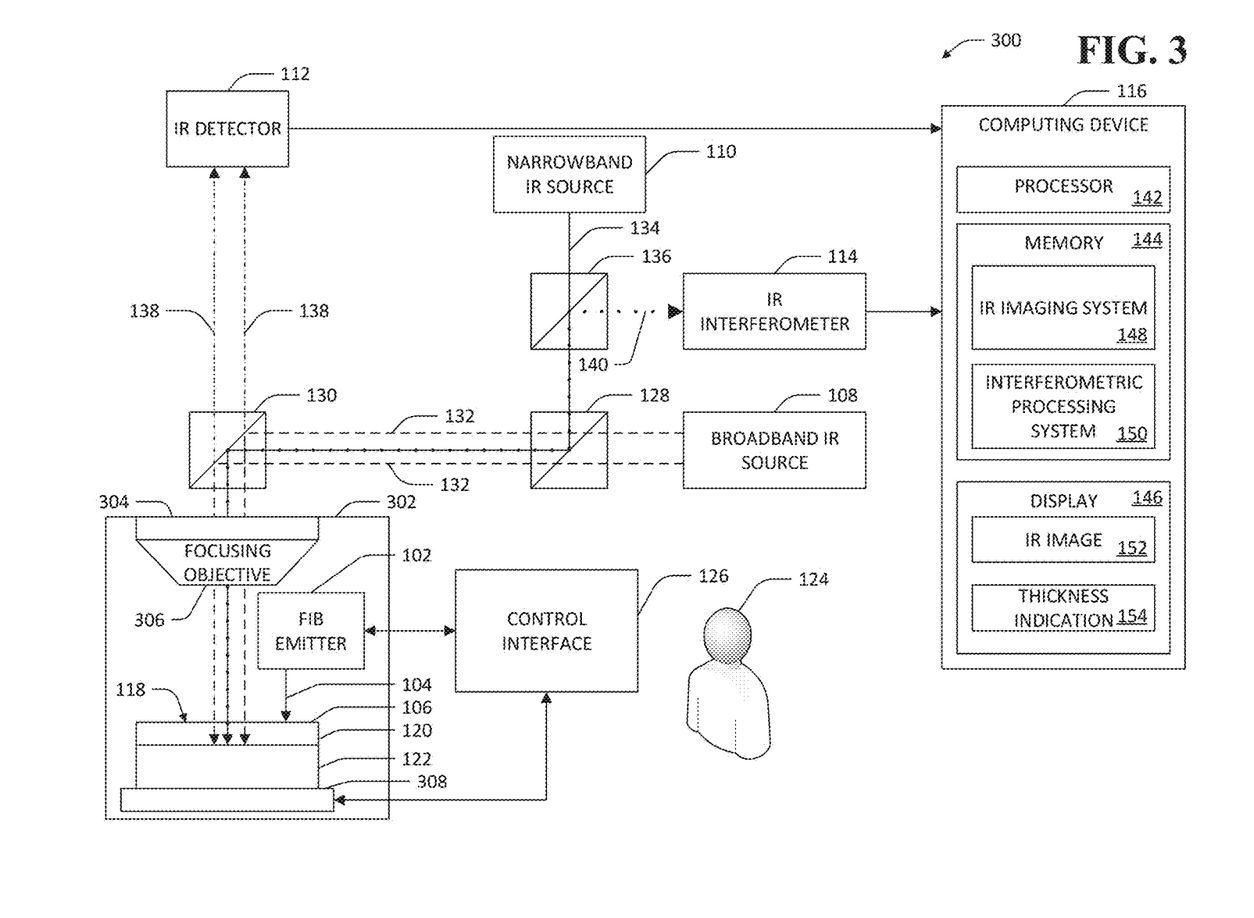
FIG. 3 is a functional block diagram of another exemplary FIB system that facilitates real-time presentment of two-dimensional IR imagery and surface layer thickness data in the vicinity of a location of incidence of the FIB at the target, wherein the target is positioned in an evacuated chamber.

Referring now to FIG. 3, an exemplary system 300 that facilitates providing real-time imagery and surface thickness data of a target to an operator of a FIB is illustrated, wherein the target and the FIB emitter are contained in a vacuum chamber. The system 300 includes the broadband IR source 108, the narrowband IR source 110, the IR detector 112, the IR interferometer 114, and the beam splitters 128, 130, 136 arranged as shown in FIG. 1 and described above with respect to the exemplary system 100. The system 300 further includes a vacuum chamber 302 in which are positioned the FIB emitter 102 and the target 106. The vacuum chamber 302 provides a clean environment for fabrication and analysis of samples by way of the FIB emitter 102. For example, the vacuum chamber 302 provides a controlled environment for fabrication of integrated circuits. The vacuum chamber 302 comprises a window 304 through which the broadband light 132 and the narrowband light 134 pass as they travel from the second beam splitter 130 to the target 106.

The system 300 further comprises a focusing objective 306 that focuses the light 132, 134 to a location on the surface 118 of the target 106 that is proximal to a location of incidence of the FIB 104 on the surface 118. For example, in a micro-scale configuration, the focusing objective 306 can focus the light 132, 134 to a location on the surface 118 of the target 106 that is within 100 microns, within 50 microns, or within 10 microns of the location of incidence of the FIB 104 on the surface 118. In another example, in a nano-scale configuration, the focusing objective 306 can focus the light 132, 134 to a location on the surface 118 of the target 106 that is within 100 nm, within 50 nm, or within 10 nm of the location of incidence of the FIB 104 on the surface 118.

In exemplary embodiments, paths of the light 132, 134 and a path of the FIB 104 may be offset by a substantially greater distance (e.g., centimeters). In such embodiments, the target 106 can be mounted on a mechanical stage that can translate the target 106 such that the light 132, 134 is focused onto a location on the surface 118 that is proximal to the location of incidence of the FIB 104 on the surface 118. Referring still to FIG. 3, the system 300 includes a stage 308 on which the target 106 is mounted. The stage 308 can be moved responsive to control signals output by the control interface 126, wherein the control signals are based upon input provided at the control interface 126 by the operator 124. By way of example, during operation of the FIB emitter 102 the stage 308 can be arranged in a first position such that the FIB 104 is directed to a location that is desirably milled by the operator 124. Responsive to receiving input from the operator 124, the control interface 126 outputs a control signal that is configured to cause the stage 308 to move to a second position. Responsive to receiving the control signal from the control interface 126, the stage 308 moves to the second position. The second position is aligned with the focusing objective 306 such that the light 132, 134 is directed to a location on the surface 118 of the target 106 that is proximal to a location of incidence of the FIB 104 at the surface 118 when the stage 308 is in the first position.

Figure 4:
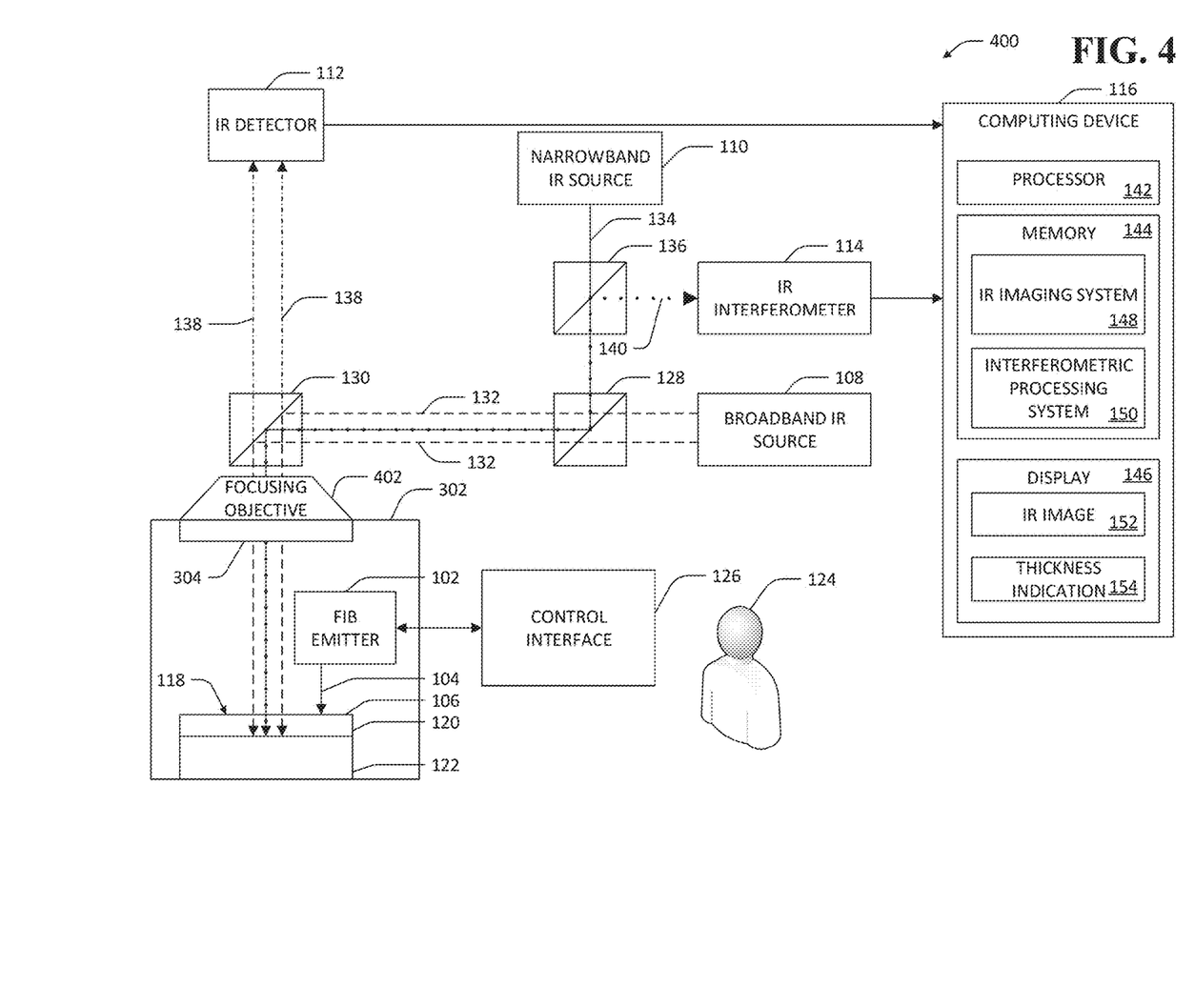
FIG. 4 is a functional block diagram of still another exemplary FIB system wherein the target is positioned in an evacuated chamber, and wherein focusing elements of an optical system are positioned outside the chamber.

Referring now to FIG. 4, an exemplary system 400 is illustrated that includes the light sources 108, 110, the IR detector 112, the interferometer 114, and the beam splitters 128, 130, 136 arranged as in FIG. 1. Further, the exemplary system 400 includes the vacuum chamber 302, with the FIB emitter 102 and the target 106 positioned inside the vacuum chamber. The system 400 additionally includes a focusing objective 402 positioned outside the vacuum chamber 302, rather than inside the vacuum chamber 302 as in the system 300. By positioning the focusing objective 402 outside the vacuum chamber 302, the focusing objective 402 can be repaired, modified, replaced, etc. without requiring the operator 124 to enter the sealed environment of the vacuum chamber 302. Similarly, since the light sources 108, 110, the optical detector 112, the interferometer 114, the beam splitters 128, 130, 136, and the computing device 116 are positioned outside the vacuum chamber, repairs, modifications, or replacements of any of these components may be done without requiring the vacuum chamber 302 to be unsealed. Thus, these elements of the system 400 can be handled without risking contamination of the target 106.

Figure 5:
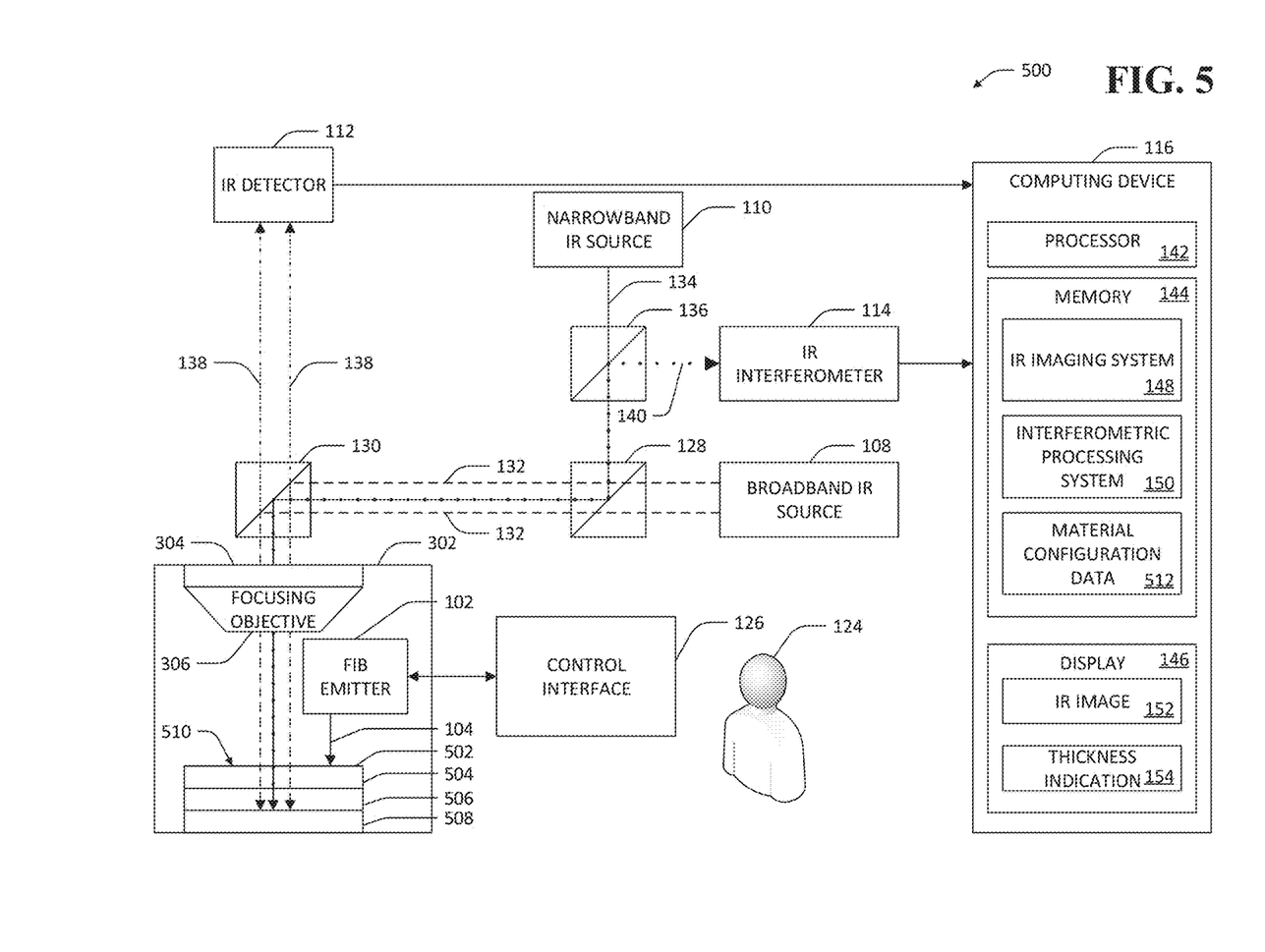
FIG. 5 is a functional block diagram of yet another exemplary FIB system configured to output data indicative of thicknesses of multiple layers of material at the target.

Referring now to FIG. 5, an exemplary system 500 is illustrated that facilitates presentment of real-time images of a target of a FIB emitter in conjunction with an indication of thicknesses of multiple layers of the target at a location proximal to a location of incidence of the FIB at the target. The exemplary system 500 comprises the light sources 108, 110, the IR detector 112, the interferometer 114, and the beam splitters 128, 130, 136 arranged as in FIG. 1. The exemplary system 500 further comprises the vacuum chamber 302 and the focusing objective 306, as in FIG. 3, wherein the focusing objective 306 and the FIB emitter 102.

The exemplary system 500 further includes a target 502 that comprises three layers 504-508. The three layers 504 include a top layer 504, a middle layer 506, and a bottom layer 508. The top layer 504 comprises a surface 510 of the target 502 that the FIB emitter mills or deposits material on by way of the FIB 104. In an example, the target 502 is an integrated circuit, and the top layer 504 of the circuit 502 is a silicon substrate layer wherein the surface 510 is a back side of the integrated circuit. In the exemplary system 500, the broadband light 132 from the broadband IR source 108 and the narrowband light 134 from the narrowband IR source 110 penetrate multiple layers 504, 506 of the target 502 and are reflected by the bottom layer 508. The reflection 140 of the narrowband light therefore comprises reflections of the narrowband light 134 from the top layer 504, the middle layer 506, and the bottom layer 508. As these reflections return along the path of the reflection 140 of the narrowband light, they interfere with one another due to phase differences caused by the different path length of each reflection. Thus, since interference of reflections from each of the layers 504-508 contribute to an interference pattern of the reflected narrowband light 140, the interference pattern is based upon thicknesses of these layers 504-508. The IR interferometer 114 outputs data indicative of the interference pattern to the computing device 116. The interferometric processing system 150 is configured to compute a thickness of each of the layers 504, 506 based upon the data received from the IR interferometer 114. The thickness indication 154 is then presented to the operator 124 of the system 500 by way of the display 146 of the computing device 116 wherein the thickness indication 154 indicates a thickness of each of the layers 504, 506.

In some embodiments, the interferometric processing system 150 can more accurately compute a thickness of layers of a target if the materials making up each layer of the target are known. Thus, in the exemplary system 500, the memory 144 comprises material configuration data 512 that is indicative of materials making up each of the layers 504-508. The interferometric processing system 150 computes the thickness of the layers 504, 506 based at least in part upon the material configuration data 512, wherein each thickness computed thereby is generally a more accurate computation of the true thickness than a thickness computed without information pertaining to materials making up the layers 504, 506. In embodiments wherein the system 500 is used for backside circuit modification, the material configuration data 512 can be provided to the computing device 116 by the operator 124 based upon a known construction of the target 502.

Figure 6:
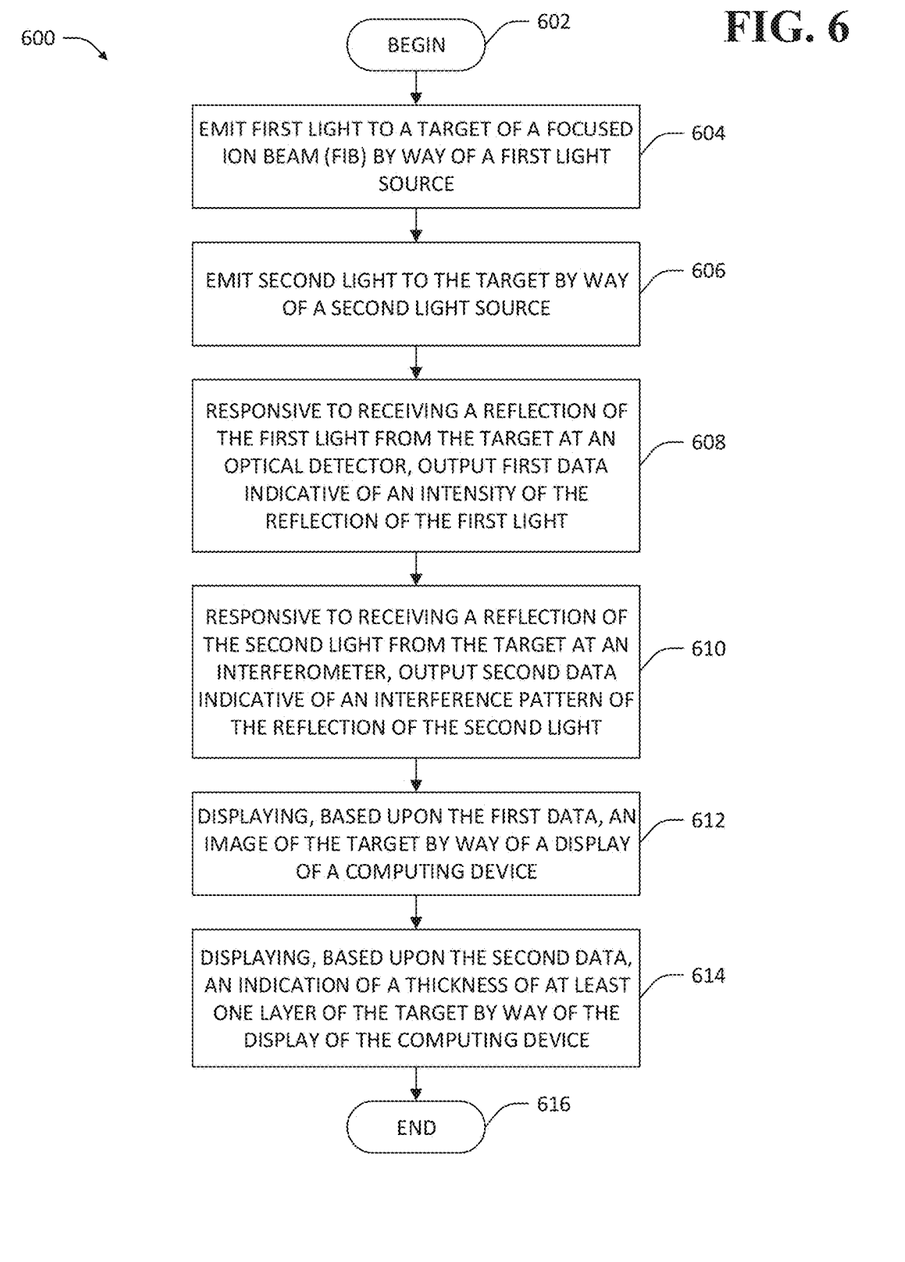
FIG. 6 is a flow diagram that illustrates an exemplary methodology for providing navigation and surface layer thickness data to an operator of a FIB system.

FIG. 6 illustrates an exemplary methodology relating to presentment of real-time image and surface layer thickness data of a target in a FIB fabrication system. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

Referring now to FIG. 6, a methodology 600 that facilitates presentment of real-time image and surface layer thickness data of a target in a FIB fabrication system is illustrated. The methodology 600 begins at 602, and at 604 first light is emitted to a target of a FIB by way of a first light source. The first light source comprises, for example, a broadband IR light source such as a lightbulb. Second light is emitted to the target by way of a second light source at 606, wherein the second light source is a narrowband light source suitable for performing interferometry (e.g., a laser or narrowband LED). At 608, responsive to receiving a reflection of the first light from the target, an optical detector outputs first data that is indicative of an intensity of the reflection of the first light. At 610, responsive to receiving a reflection of the second light from the target, second data is output by an interferometer, wherein the second data is indicative of an interference pattern of the reflection of the second light. At 612, an image of the target is displayed by way of a display of a computing device based upon the first data. An indication of a thickness of at least one layer of the target is displayed by way of the display of the computing device based upon the second data at 614, whereupon the methodology 600 ends 616.

Figure 7:
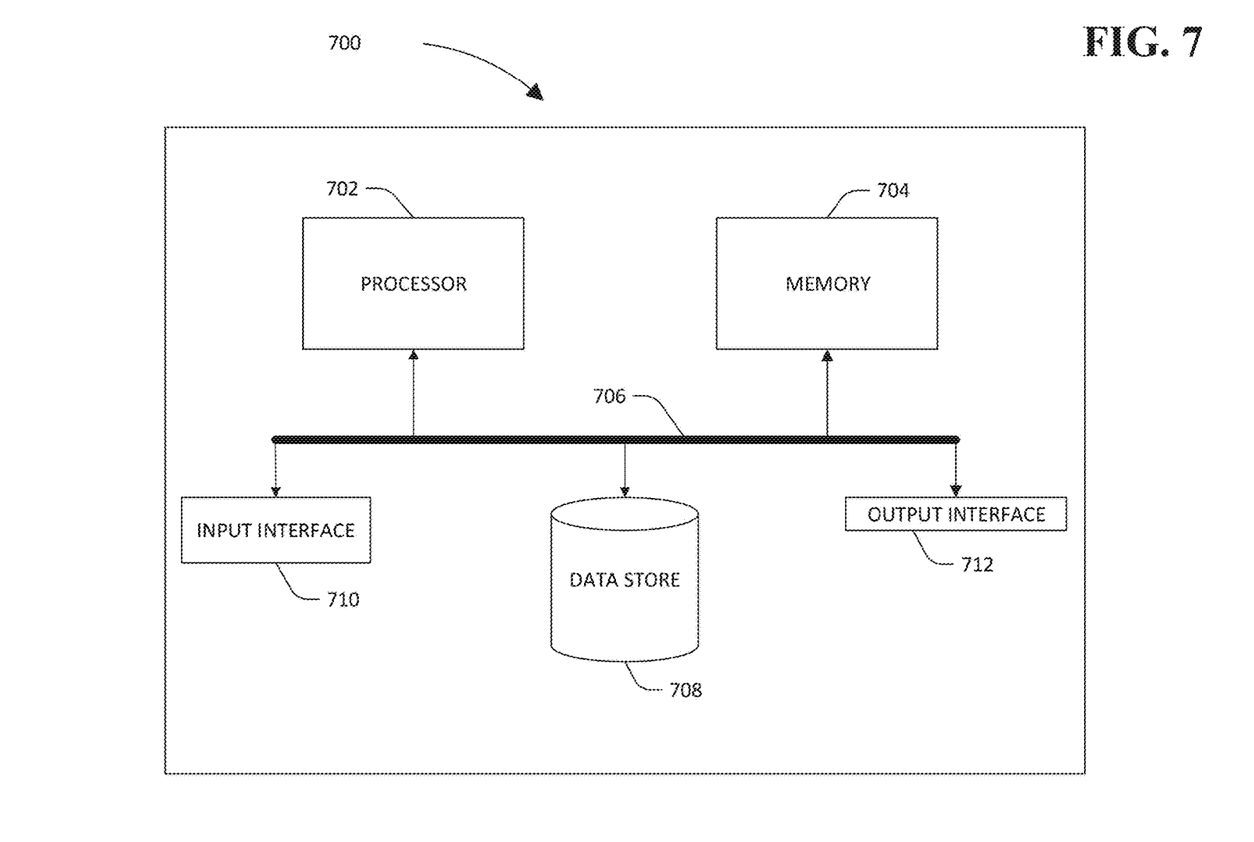
FIG. 7 is an exemplary computing system.

Referring now to FIG. 7, a high-level illustration of an exemplary computing device 700 that can be used in accordance with the systems and methodologies disclosed herein is illustrated. For instance, the computing device 700 may be used in a system that generates images based upon output of an optical detector (e.g., the IR detector 112) or a system that computes material thicknesses of samples based upon interferometry. By way of another example, the computing device 700 can be used in a system that facilitates presentment of such images or indications of material thickness on a display for an operator of a FIB system. The computing device 700 includes at least one processor 702 that executes instructions that are stored in a memory 704. The instructions may be, for instance, instructions for implementing functionality described as being carried out by one or more components discussed above or instructions for implementing one or more of the methods described above. The processor 702 may access the memory 704 by way of a system bus 706. In addition to storing executable instructions, the memory 704 may also store material configuration data, image data, etc.

The computing device 700 additionally includes a data store 708 that is accessible by the processor 702 by way of the system bus 706. The data store 708 may include executable instructions, configuration data, image data, etc. The computing device 700 also includes an input interface 710 that allows external devices to communicate with the computing device 700. For instance, the input interface 710 may be used to receive instructions from an external computer device, from a user, etc. The computing device 700 also includes an output interface 712 that interfaces the computing device 700 with one or more external devices. For example, the computing device 700 may display text, images, etc. by way of the output interface 712.

It is contemplated that the external devices that communicate with the computing device 700 via the input interface 710 and the output interface 712 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 700 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 700 may be a distributed system. Thus, for instance, several devices may be in communication by way of a network connection and may collectively perform tasks described as being performed by the computing device 700.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A system, comprising:
   a focused ion beam (FIB) emitter that emits a FIB at a first spot on a target, the target comprising a plurality of layers;
   a first light source that illuminates the target with first light;
   a second light source that emits second light to a second spot on the target, the second spot offset from the first spot;
   an optical detector configured to receive a reflection of the first light from the target and to output first data indicative of an intensity of the reflection of the first light received at the optical detector;
   an interferometer configured to receive a reflection of the second light from the target and to output second data indicative of an interference pattern of the reflection of the second light; and
   a computing device, the computing device configured to output an image of the target based upon the first data, the computing device further configured to output an indication of a thickness of at least one layer in the plurality of layers of the target based upon the second data.

2. The system of claim 1, wherein the first light source and the second light source are infrared (IR) light sources.

3. The system of claim 2, wherein the first light source has a first spectral characteristic, and wherein the second light source has a second spectral characteristic.

4. The system of claim 3, wherein the second spectral characteristic comprises a narrower band of wavelengths than the first spectral characteristic.

5. The system of claim 4, the second spectral characteristic having a bandwidth of less than 200 nanometers.

6. The system of claim 4, the first spectral characteristic having a bandwidth of at least 200 nanometers.

7. The system of claim 1, wherein the optical detector comprises an array of charge-coupled devices (CCDs).

8. The system of claim 1, further comprising a vacuum chamber, the target positioned inside the vacuum chamber, the vacuum chamber comprising a window, and wherein the first light and the second light pass through the window to the target.

9. The system of claim 8, further comprising a focusing objective, the focusing objective configured to focus the first light and the second light onto the target at a location proximal to a location of incidence of the FIB at the target.

10. The system of claim 9, wherein the focusing objective is positioned inside the vacuum chamber.

11. The system of claim 9, wherein the focusing objective is positioned outside the vacuum chamber.

12. The system of claim 1, further comprising:
    a first beam splitter that receives the first light from the first light source and second light from the second light source and outputs a beam that comprises the first light and the second light; and
    a second beam splitter that receives the beam and directs the beam to the target, wherein further the second beam splitter receives a reflection of the beam and directs the reflection of the first light to the optical detector.

13. The system of claim 12, further comprising a third beam splitter, wherein the second beam splitter is further configured to direct the reflection of the second light to the first beam splitter, the first beam splitter further configured to direct the reflection of the second light to the third beam splitter, and wherein the third beam splitter directs the reflection of the second light to the interferometer.

14. The system of claim 1, wherein the second light source comprises one of:
    a light-emitting diode (LED); or
    a laser.

15. The system of claim 1, the computing device configured to output an indication of a thickness of each of a plurality of layers of the target based upon the second data.

16. The system of claim 1, the computing device configured to output the indication of the thickness of the at least one layer based further upon a material comprising the at least one layer.

17. A method, comprising:
    emitting first light to a target of a focused ion beam (FIB) by way of a first light source;
    emitting second light to a spot on the target by way of a second light source, the spot being offset from a location of incidence of the FIB on the target;
    responsive to receiving a reflection of the first light from the target at an optical detector, outputting first data indicative of an intensity of the reflection of the first light to a computing device;

responsive to receiving a reflection of the second light from the target at an interferometer, outputting second data indicative of an interference pattern of the reflection of the second light to the computing device;

displaying, based upon the first data, an image of the target of the FIB based upon the first data by way of a display of the computing device; and displaying, based upon the second data, an indication of a thickness of at least one layer of the target by way of the display of the computing device.

18. The method of claim 17, wherein the image of the target and the indication of the thickness of the at least one layer of the target are updated in real time.

19. A system, comprising:

a focused ion beam emitter (FIB) that emits a focused beam of ions at a first spot on a target;

a first infrared (IR) light source that emits first light that illuminates the target;

a second IR light source that emits second light to a second spot on the target, the second spot offset from the first spot;

an IR optical detector, the IR optical detector configured to receive a reflection of the first light from the target, the IR optical detector further configured to output first data indicative of an intensity of the reflection of the first light;

an IR interferometer, the IR interferometer configured to receive a reflection of the second light from the target, the IR interferometer further configured to output second data indicative of an interference pattern of the reflection of the second light; and a computing device that is configured to display a two-dimensional image of the target responsive to receiving the first data and to display an indication of a thickness of at least one material layer of the target responsive to receiving the second data.

* * * * *